(12) United States Patent
Wang et al.

(10) Patent No.: US 11,442,113 B2
(45) Date of Patent: Sep. 13, 2022

(54) ON-LINE ESTIMATION METHOD OF BATTERY STATE OF HEALTH IN WIDE TEMPERATURE RANGE BASED ON "STANDARDIZED TEMPERATURE"

(71) Applicant: JIANGSU UNIVERSITY, Zhenjiang (CN)

(72) Inventors: Limei Wang, Zhenjiang (CN); Dong Lu, Zhenjiang (CN); Xiuliang Zhao, Zhenjiang (CN); Sibing Qiao, Zhenjiang (CN); Ying Xu, Zhenjiang (CN); Chaofeng Pan, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 17/603,599

(22) PCT Filed: Jan. 5, 2021

(86) PCT No.: PCT/CN2021/070228
§ 371 (c)(1),
(2) Date: Oct. 14, 2021

(87) PCT Pub. No.: WO2021/238228
PCT Pub. Date: Dec. 2, 2021

(65) Prior Publication Data
US 2022/0146591 A1    May 12, 2022

(30) Foreign Application Priority Data
May 28, 2020  (CN) .......................... 202010468280.4

(51) Int. Cl.
*G01R 31/392*    (2019.01)
*G01R 31/36*     (2020.01)

(52) U.S. Cl.
CPC ....... *G01R 31/392* (2019.01); *G01R 31/3648* (2013.01)

(58) Field of Classification Search
CPC .......................... G01R 31/392; G01R 31/3648
(Continued)

(56) References Cited

U.S. PATENT DOCUMENTS

2017/0317366 A1    11/2017 Ryu et al.

FOREIGN PATENT DOCUMENTS

| CN | 102230953 A | 11/2011 |
|----|-------------|---------|
| CN | 107015155 A | 8/2017  |

(Continued)

OTHER PUBLICATIONS

Zhang et al., "Lithium-Ion Battery Remaining Useful Life Prediction With Box-Cox Transformation and Monte Carlo Simulation", Feb. 2019, IEEE Transactions on Industrial Electronics, vol. 66, No. 2, pp. 1585-1597. (Year: 2019).*

(Continued)

*Primary Examiner* — Ricky Go
(74) *Attorney, Agent, or Firm* — Bayramoglu Law Offices LLC

(57) ABSTRACT

An on-line State of Health estimation method of a battery in a wide temperature range based on "standardized temperature" includes: calculating battery Incremental Capacity curve of a battery, establishing a quantitative relationship between the voltage shift of the temperature-sensitive feature point and the temperature of a standard battery, standardized transformation of Incremental Capacity curves at (Continued)

different temperatures, establishing a quantitative relationship between the transformed height of the capacity-sensitive feature point and the State of Health based on a BOX-COX transformation. The BOX-COX transformation is expressed as $$y_k^{(\lambda)} = \begin{cases} \dfrac{y_k^\lambda - 1}{\lambda} & \lambda \neq 0 \\ \ln y_k & \lambda = 0 \end{cases}.$$

An maximum likelihood function is used to calculate the optimal $\lambda$, and the transformed height of the capacity-sensitive feature point y can be acquired. The quantitative relationship between transformed height of the capacity-sensitive feature point and the State of Health is established to obtain the State of Health.

7 Claims, 6 Drawing Sheets

(58) Field of Classification Search
USPC .......................................................... 702/63
See application file for complete search history.

(56) References Cited

FOREIGN PATENT DOCUMENTS

| CN | 108037460 A | 5/2018 |
| CN | 108169680 A | 6/2018 |
| CN | 109632138 A | 4/2019 |
| CN | 110927586 A | 3/2020 |

OTHER PUBLICATIONS

Liu et al., "A Health Indicator Extraction and Optimization Framework for Lithium-Ion Battery Degradation Modeling and Prognostics", Jun. 2015, IEEE Transactions on Systems, MAN, and Cybernetics: Systems, vol. 45, No. 6, pp. 915-928. (Year: 2015).*
Meng et al., "A review on prognostics and health management (PHM) methods of lithium-ion batteries", Sep. 2019, Renewable and Sustainable Energy Reviews 116 (2019) 109405, pp. 1-12. (Year: 2019).*
Schoch, "Battery Life Optimal Operation of Electric Vehicles", 2018, pp. 22-24, 63. (Year: 2018).*
Zang Hao, SOH estimation and DSP implementation of lithium ion battery based on characteristic parameters of IC curve, 2018, Beijing Jiaotong University.

* cited by examiner

ON-LINE ESTIMATION METHOD OF BATTERY STATE OF HEALTH IN WIDE TEMPERATURE RANGE BASED ON "STANDARDIZED TEMPERATURE"

CROSS REFERENCE TO THE RELATED APPLICATIONS

This application is the national phase entry of International Application No. PCT/CN2021/070228, filed on Jan. 5, 2021, which is based upon and claims priority to Chinese Patent Application No. 202010468280.4, filed on May 28, 2020, the entire contents of which are incorporated herein by reference.

TECHNICAL FIELD

The present invention belongs to the electric vehicle technology, specifically relates to the State of Health estimation of a battery.

BACKGROUND

Accurate State of Health estimation is of great significance for improving battery safety and extending battery life. However, due to the complicated working conditions and various influencing factors in the actual conditions, it is difficult to estimate the State of Health accurately and effectively.

State of Health is generally estimated by a maximum available capacity method or an internal resistance method. At present, battery State of Health is mostly obtained by establishing models, such as an electrochemical model, an empirical model and an equivalent circuit model. Though the calculation results of the electrochemical model are extremely accurate, the model parameters of the electrochemical model are too numerous to obtain and the calculation process is very complicated. The empirical model requires a large amount of test data and takes a long time, resulting in a poor versatility. The equivalent circuit model equates a battery by some resistors and capacitors with a series-parallel structure. Although the State of Health is monitored in real time, the accuracy is not high, and multiple optimization algorithms are usually required.

An incremental capacity curve is obtained by deriving a charging curve of a battery. The incremental capacity curve directly reflects the multi-stage lithium ions intercalation process when the battery is charged. It is a non-destructive method to detect the internal reaction of the battery. By studying the relationship between the inflection points of the Incremental Capacity curve and the State of Health at a standard temperature, a State of Health estimation method by the Incremental Capacity curve is proposed. However, the internal chemical reaction of a battery is directly affected by the temperature, so many basic battery parameters, such as the capacity and internal resistance, will change with the temperature. Meanwhile, the Incremental Capacity curve will also shift with the temperature. The accuracy of the State of Health estimation method by the Incremental Capacity curve varies greatly at different temperatures. Therefore, a State of Health estimation method in a wide temperature range needs to be explored.

SUMMARY

To solve the above problems, based on "standardized temperature", an online State of Health estimation method in a wide temperature range is proposed. It mainly includes calculating Incremental Capacity curve of a battery, establishing a quantitative relationship between the voltage shift of the temperature-sensitive feature point and the temperature of a standard battery, standardized transformation of Incremental Capacity curves at different temperatures and establishing a quantitative relationship between the transformed height of the capacity-sensitive feature point and the State of Health of the battery based on a BOX-COX transformation.

The mentioned Incremental Capacity curve is often calculated by a conventional numerical differentiation method, and by a polynomial fitting and differentiation method. It can also be calculated by referring to the invention patent CN 109632138 A. The present invention only provides examples, the specific calculated method is not limited.

The method of establishing the quantitative relationship between the voltage shift of the temperature-sensitive feature point and the temperature of a standard battery is as follows:

The internal resistance of a battery increases as the temperature decreases, resulting in the increase of kinetic loss. The increase of internal resistance is mainly manifested as the right shift of the Incremental Capacity curve and the voltage shift of inflection points in the Incremental capacity curve, as shown in FIG. 1. Therefore, the second inflection point in the Incremental Capacity curve is selected as the temperature-sensitive feature point to establish the quantitative relationship between the voltage shift of the temperature-sensitive feature point and the temperature. Firstly, two standard batteries, new batteries, are selected to stand for 2 hours at each fixed ambient temperature (−5° C., 0° C., 5° C., 10° C., 15° C., 20° C., 25° C., 30° C., 35° C., 40° C., 45° C., 50° C., 55° C.) to ensure the consistent temperature inside and outside the standard batteries. Then, the standard batteries are charged with 0.1 C, and the Incremental Capacity curves at different temperatures are extracted from the charging curves. Subsequently, the voltages of the temperature-sensitive feature point at each temperature are recorded. To describe the quantitative relationship between voltage shift of the temperature-sensitive feature and the temperature, taking the standard temperature (25° C.) as a reference, the quantitative relationship between the voltage shift of the temperature-sensitive feature point and the temperature is obtained by subtracting voltage of the temperature-sensitive feature point at the standard temperature from the voltage of the temperature-sensitive feature point at other temperatures. And an Arrhenius fitting function is utilized to fit the quantitative relationship:

$$y = a\exp\left(\frac{b}{T}\right) + c \quad (1)$$

Where a, b, c are the fitting parameters, T is the temperature, and y represents the voltage shift of temperature-sensitive feature point.

The above standardized transformation of Incremental Capacity curves at different temperatures is as follows:

The Incremental Capacity curves at different temperatures are standardized to ensure the accurate estimation of State of Health in a wide range temperature. According to the quantitative relationship between the voltage shift of the temperature-sensitive feature point and the temperature by Arrhenius fitting function, a charging Q-V curve at each high temperature (upper 30° C.) is shifted with the corresponding voltage shift (bringing the temperature into the Arrhenius fitting equation) to get a normalized charging Q-V curve. Then, a normalized Incremental Capacity curve by standardized temperature is obtained through the conventional numerical differentiation method.

Based on a BOX-COX transformation, the quantitative relationship between the transformed height of the capacity-sensitive feature point and the State of Health of the battery is established as follows:

As the battery ages, battery's cathode and anode active materials and recyclable lithium ions are gradually lost. They are mainly reflected in the height decrease of the Incremental Capacity curve, as shown in FIG. 1. Therefore, the height of the second inflection point is used as the capacity-sensitive feature point.

In this method, the Box-Cox transformation is used to increase the linearity between the height of the capacity-sensitive feature point and the State of Health. A linear regression equation is expressed as:

$$Y = X\beta + \varepsilon \qquad (2)$$

Where, Y is the dependent variable, X is the independent variable, $\beta$ is the coefficient matrix, and $\varepsilon$ represents the fitting error.

The Box-Cox transformation is expressed as:

$$y_k^{(\lambda)} = \begin{cases} \dfrac{y_k^\lambda - 1}{\lambda} & \lambda \neq 0 \\ \ln y_k & \lambda = 0 \end{cases} \qquad (3)$$

Where, y in the right side of the equation is the original variable, and the subscript k corresponding toy represents the k-th variable. $\lambda$ is the conversion parameter. $y_k^{(\lambda)}$ in the left side of the equation is the k-th conversion variable.

According to the above formula, the inverse transformation of y is:

$$y_k = \begin{cases} (1 - \lambda y_k^{(\lambda)})^{1/\lambda} & \lambda \neq 0 \\ \exp(y_k^{(\lambda)}) & \lambda = 0 \end{cases} \qquad (4)$$

A maximum likelihood function is used to calculate the optimal $\lambda$. Assuming that $\varepsilon$ is independent and obeys normal distribution, and y conforms to y~(X$\beta$,$\sigma^2$I), X is the independent variable matrix, $\beta$ is the coefficient matrix, $\sigma^2$ is the variance, I is the identity matrix, n is the number of samples. The maximum likelihood function is expressed as:

$$L(\beta, \sigma^2 \mid Y, X) = \qquad (5)$$
$$-\frac{n}{2}\ln 2\pi - \frac{n}{2}\ln \sigma^2 - \frac{1}{2}\sigma^{-2}[Y^{(\lambda)} - X\beta]^T [Y^{(\lambda)} - X\beta] + (\lambda - 1)\sum_{k=1}^{n} \ln y_k$$

In the above formula (5), $Y^{(\lambda)}$ is the dependent variable after conversion. The estimated parameters $\beta$ and $\sigma^2$ can be expressed as:

$$\begin{cases} \beta(\lambda) = (X^T X)^{-1} X^T Y^\lambda \\ \sigma^2(\lambda) = \dfrac{1}{n}[Y^{(\lambda)} - X\beta]^T [Y^{(\lambda)} - X\beta] \end{cases} \qquad (6)$$

Substituting formula (6) into (5) and taking logarithmic:

$$L(\lambda) = -\frac{n}{2}(\ln 2\pi + \ln \sigma^2 + 1) + (\lambda - 1)\sum_{k=1}^{n} \ln y_k \qquad (7)$$

The optimal $\lambda$ is obtained by maximizing formula (7).

According to the linear fitting formula (2), the quantitative relationship between transformed height of capacity-sensitive feature point and the State of Health is established.

The Benefits of the Invention:

1. According to standardized temperature, the temperature range of the State of Health estimation method by the Incremental Capacity curve is effectively broadened. The accuracy of the State of Health estimation by the Incremental Capacity curve in a wide temperature range is also improved by "standardized temperature" transformation.

2. The Box-Cox transformation is introduced to reduce the influence of random errors on the estimation result, increase the linearity between the height of the capacity-sensitive feature point and the State of Health, and improves the stability of the State of Health estimation by the Incremental Capacity curve.

DETAILED DESCRIPTION OF THE EMBODIMENTS

It will be further explained below about the figures.

Figure 1:
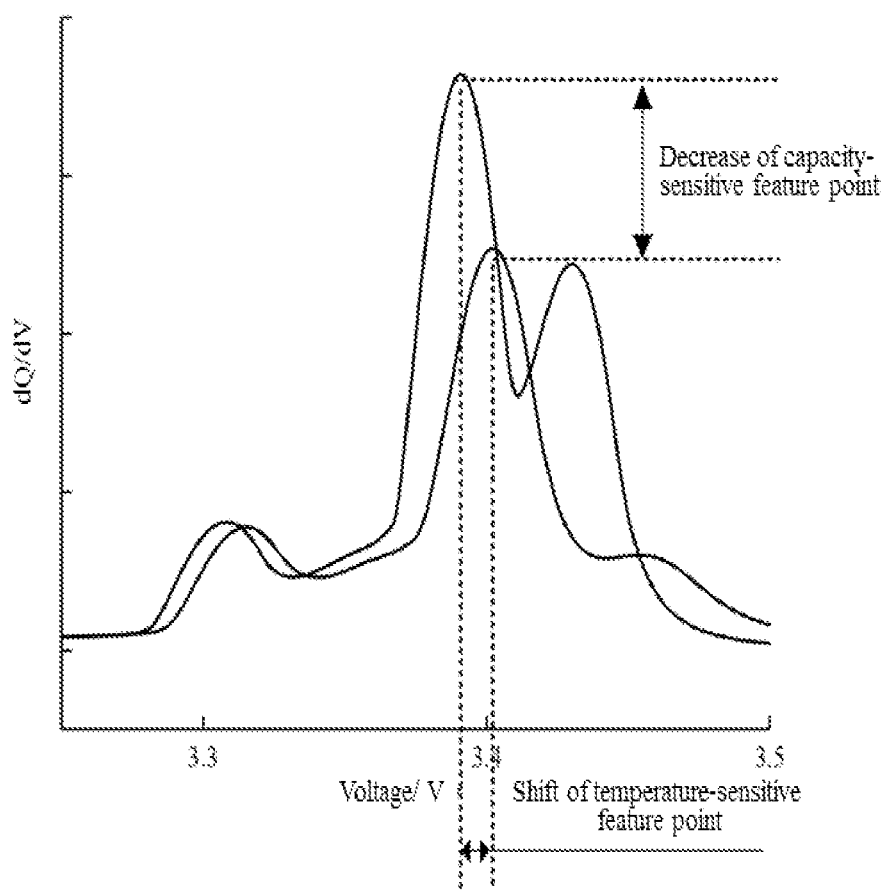
FIG. 1 shows the Incremental Capacity curves at different State of Health and temperature.

FIG. 1 gives the Incremental Capacity curves at different State of Health and temperature. When the temperature decreases, the Incremental Capacity curve has a right shift, and the height of inflection point decreases as the battery ages. But the height of the inflection point is also affected by the voltage, so the voltage shift caused by temperature is excluded by temperature standardized transformation.

Figure 2:
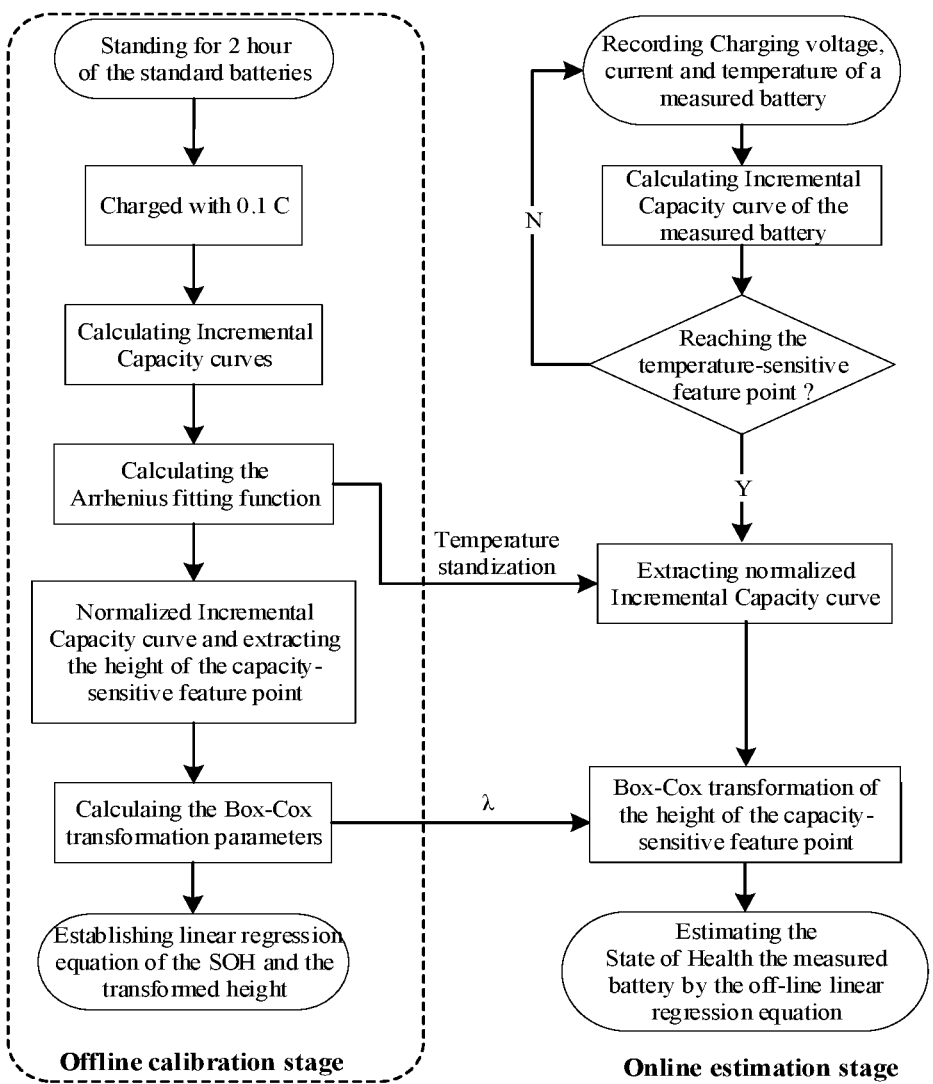
FIG. 2 gives the procedure of the proposed State of Health estimation method.

FIG. 2 gives the procedure of the proposed State of Health estimation in the invention. It mainly includes two parts, an offline calibration stage and an online estimation stage.

The State of Health of the selected five batteries are shown in Table. 1.

TABLE 1

| Battery | No. 1 | No. 2 | No. 3 | No. 4 | No. 5 |
|---|---|---|---|---|---|
| State of Health | 0.98 | 0.88 | 0.82 | 0.70 | 0.56 |

Figure 3:
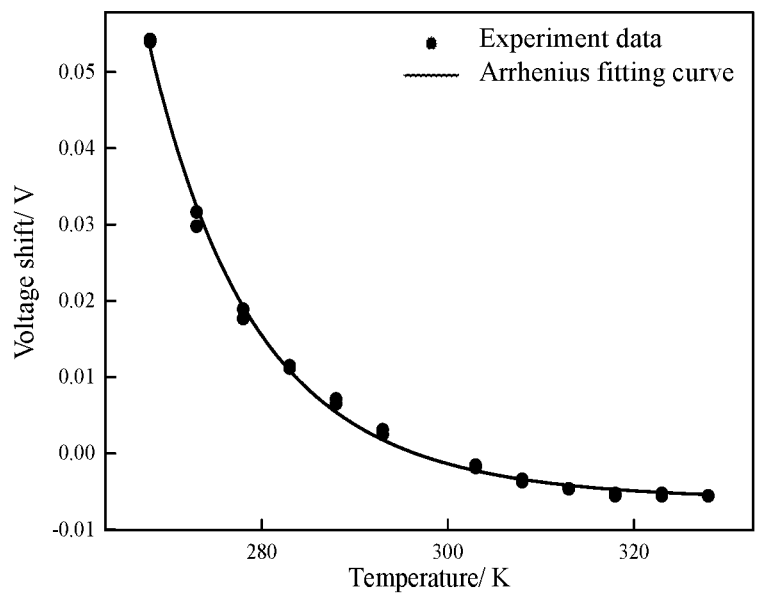
FIG. 3 shows the fitting curve of the voltage shifts with temperatures.
Figure 4:
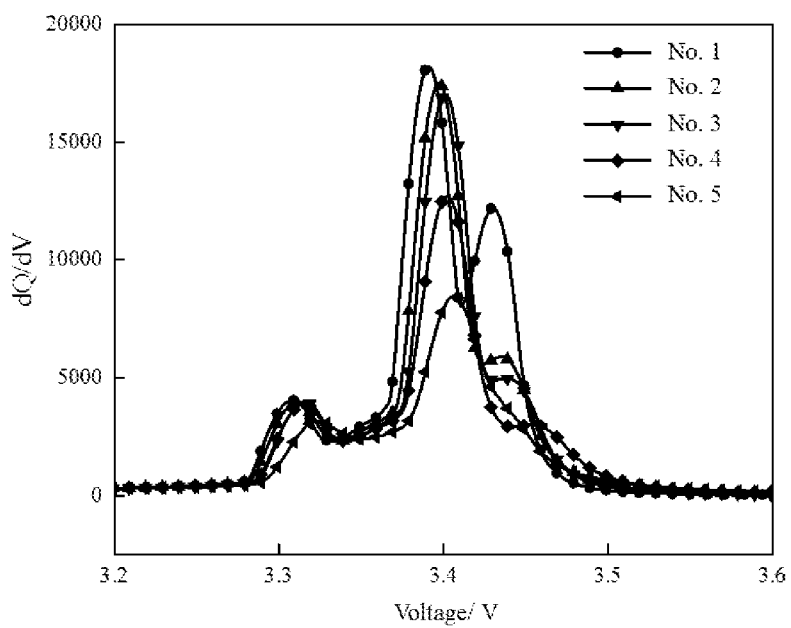
FIG. 4-FIG. 9 shows the normalized Incremental Capacity curve at 30° C., 35° C., 40° C., 45° C., 50° C. and 55° C. respectively.
Figure 5:
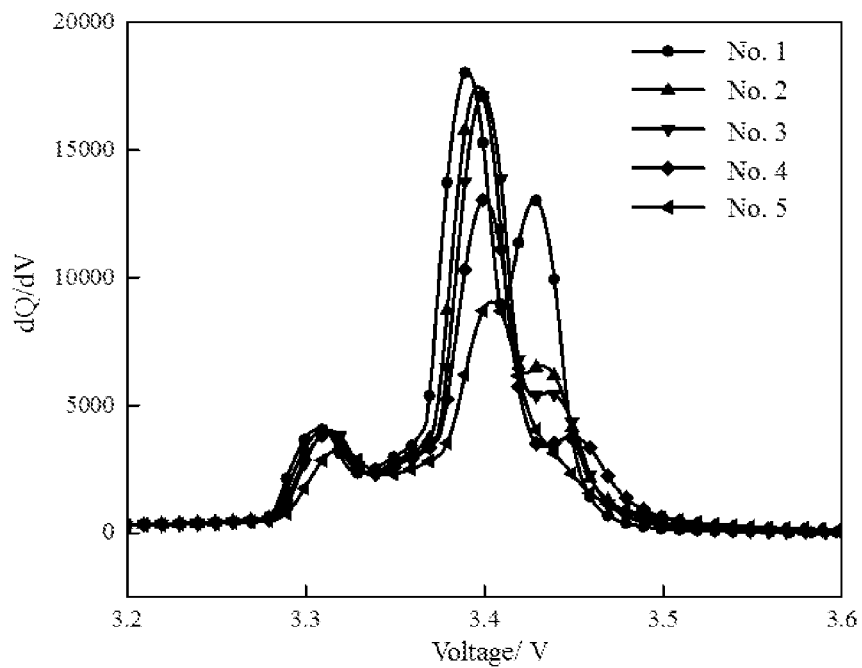
Figure 6:
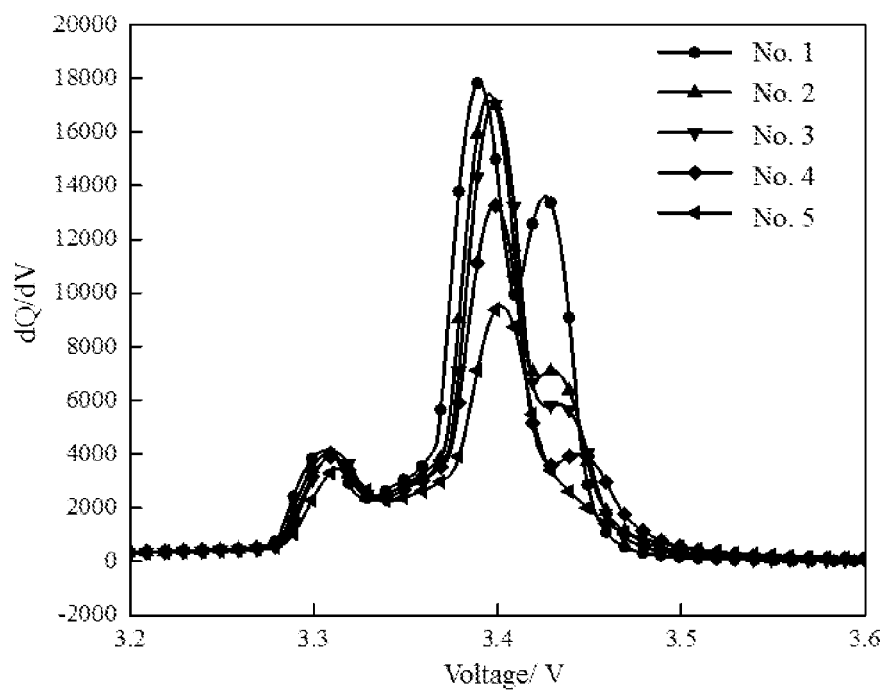
Figure 7:
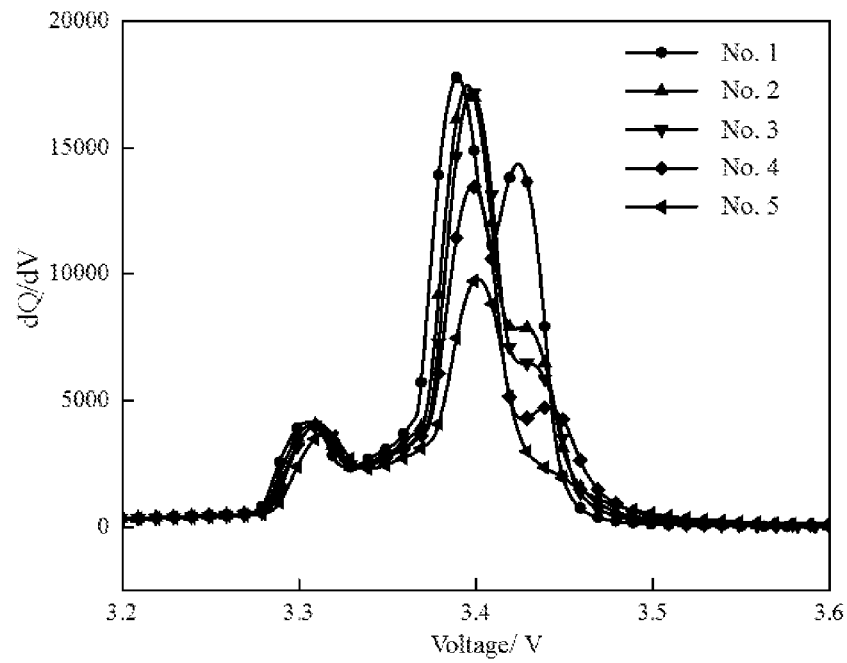
Figure 8:
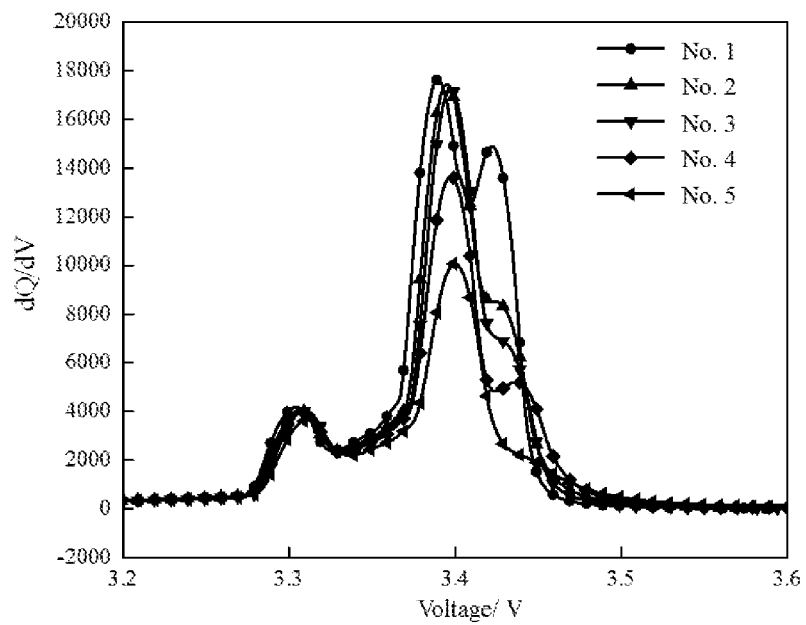
Figure 9:
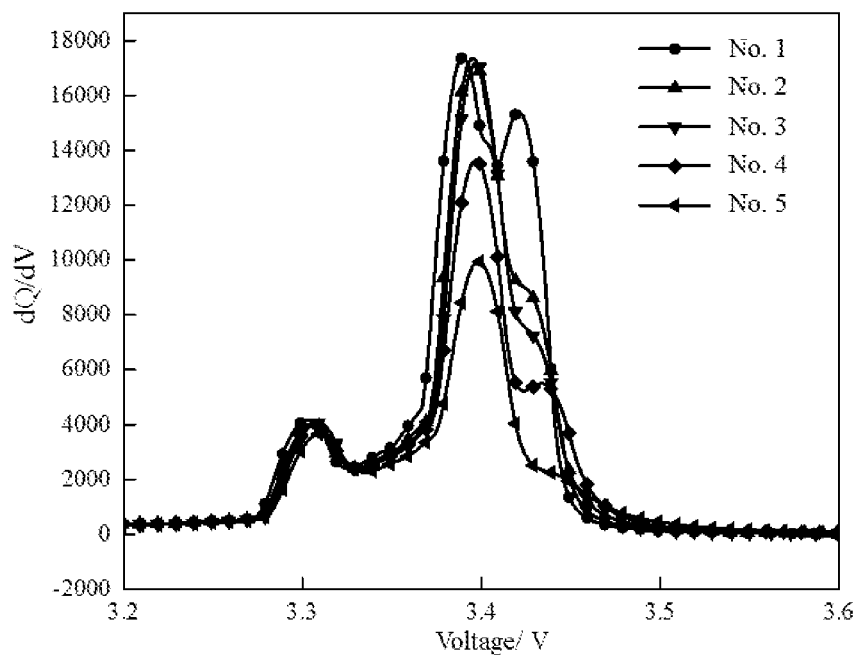

In the offline calibration stage, the standard batteries, new batteries, are stand for 2 hours at each fixed ambient temperature (−5° C., 0° C., 5° C., 10° C., 15° C., 20° C., 25° C., 30° C., 35° C., 40° C., 45° C., 50° C., 55° C.) to ensure the consistent temperature inside and outside the standard batteries. Then, the standard batteries are charged with 0.1 C, and the Incremental Capacity curves at different temperatures are extracted from the charging curves by numerical calculation. The quantitative relationship between the voltage shift of the temperature-sensitive feature point and the temperature is obtained by subtracting the voltage of the temperature-sensitive feature point at the standard temperature from the voltage of the temperature-sensitive feature point at other temperatures. Then, the Arrhenius fitting function is utilized to fit the quantitative relationship. The fitting results are shown in FIG. 3, and the parameters a=3.66328E−12, b=6300·19841, c=−0.00621.

According to the fitting results, the charging curve at each high temperature (upper 30° C.) is shifted with the corresponding voltage shift to get the normalized charging Q-V curve. Then, the normalized Incremental Capacity curve at standardized temperature is obtained by the conventional numerical differentiation method, by the polynomial fitting and differentiation method or by referring to the invention patent CN 109632138 A. FIG. 4-FIG. 9 are shows the normalized Incremental Capacity curves under 30° C., 35° C., 40° C., 45° C., 50° C., 55° C., respectively.

After that, the height of the capacity-sensitive feature point is extracted and transformed by the Box-Cox method.

The Box-Cox transformation is expressed as:

$$y_k^{(\lambda)} = \begin{cases} \dfrac{y_k^\lambda - 1}{\lambda} & \lambda \neq 0 \\ \ln y_k & \lambda = 0 \end{cases} \quad (8)$$

Where, y in the right side of the equation is the original variable, and the subscript k corresponding to y represents the k-th variable. $\lambda$ is the calculated conversion parameter. $y_k^{(\lambda)}$ in the left side of the equation is the k-th conversion variable.

According to the above formula, the inverse transformation of y is:

$$y_k = \begin{cases} (1 - \lambda y_k^{(\lambda)})^{1/\lambda} & \lambda \neq 0 \\ \exp(y_k^{(\lambda)}) & \lambda = 0 \end{cases} \quad (9)$$

The maximum likelihood function is used to calculate the optimal $\lambda$. Assuming that $\varepsilon$ is independent and obeys normal distribution, and y conforms to y∼(X$\beta$,$\sigma^2$I) X is the independent variable matrix, $\beta$ is the coefficient matrix, $\sigma^2$ is the variance, I is the identity matrix, the maximum likelihood function is expressed as:

$$L(\beta, \sigma^2 \mid Y, X) = \quad (10)$$
$$-\frac{n}{2}\ln 2\pi - \frac{n}{2}\ln\sigma^2 - \frac{1}{2}\sigma^2[Y^{(\lambda)} - X\beta]^T[Y^{(\lambda)} - X\beta] + (\lambda - 1)\sum_{k=1}^{n}\ln y_k$$

Where, n is the total number of samples. The estimated parameters $\beta$ and $\sigma^2$ can be expressed as:

$$\begin{cases} \beta(\lambda) = (X^T X)^{-1} X^T Y^\lambda \\ \sigma^2(\lambda) = \dfrac{1}{n}\sigma^2[Y^{(\lambda)} - X\beta]^T[Y^{(\lambda)} - X\beta] \end{cases} \quad (11)$$

Substituting formula (11) into (10) and taking logarithmic:

$$L(\lambda) = -\frac{n}{2}(\ln 2\pi + \ln\sigma^2 + 1) + (\lambda - 1)\sum_{k=1}^{n}\ln y_k \quad (12)$$

Taking its maximum value to get $\lambda$=3.3, and bringing it into formula (8) to get the transformed height of the capacity-sensitive feature point.

Figure 10:
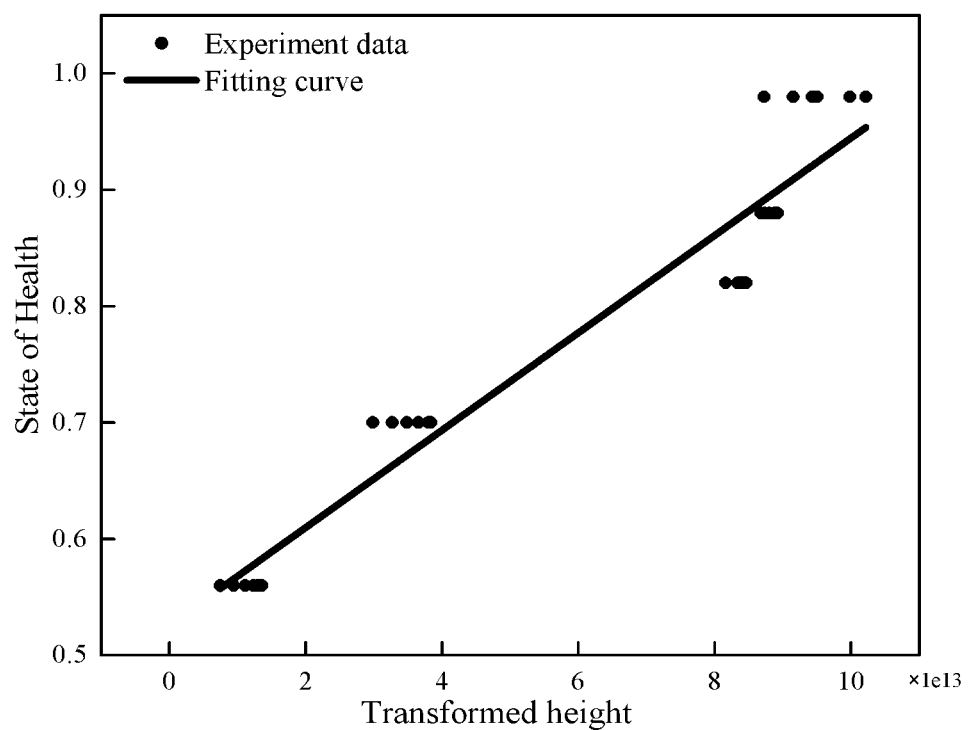
FIG. 10 shows the fitting results of State of Health and the transformed height of the capacity-sensitive feature point.

The relationship between the transformed height of the capacity-sensitive feature point and the State of Health is established, as shown in FIG. 10. The coefficient matrix in the linear regression equation (2) is $\beta$=[0.52055, 1.24712E−14]$^T$.

In the online estimation stage, the charging voltage, current and temperature data of a measured battery are firstly recorded when the measured battery is charged, and then the Incremental Capacity curve is obtained. When the voltage of the temperature-sensitive feature point is reached, the normalized Incremental Capacity curve by standardized temperature is obtained according to the Arrhenius fitting function calibrated in the offline calibration stage. Then the Box-Cox transformation is performed on the height of the capacity-sensitive feature point of the measured battery, and the conversion parameter A has been calculated by the offline calibration stage. Finally, the transformed data is brought into the offline calibrated linear regression equation to estimate the State of Health of the measured battery.

The details above are only specific descriptions of the feasible implementations of the present invention. They are not used to limit the scope of protection of the present invention. Any equivalent methods or modifications created by the above technology should be included in the protection scope of the present invention.

What is claimed is:
1. An on-line State of Health estimation method for a battery in a wide temperature range comprising the following steps:
    S1. generating a plurality of incremental capacity curves for a battery based on a plurality of charging curves for the battery, wherein each of the charging curves for the battery is obtained by holding the battery for 2 hours at fixed ambient temperatures of −5° C. 0° C. 5° C. 10° C. 15° C. 20° C. 25° C. 30° C. 35° C. 40° C. 45° C. 50° C. 55° C. and then charging each battery with 0.1 C to obtain the charging curve at each of the fixed ambient temperatures for the battery;

S2. selecting a temperature-sensitive feature point for each of the incremental capacity curves of the battery at different fixed ambient temperatures, wherein the temperature-sensitive feature point is a second inflection point of the incremental capacity curve, and determining a quantitative relationship between g voltage shift of the temperature-sensitive feature point and each fixed ambient temperature other than 25° C. based on the temperature of the battery at 25° C. by subtracting a voltage at the temperature-sensitive feature point for the battery at 25° C. from a voltage of the temperature-sensitive feature point of the battery at a temperature other than 25° C. and applying an Arrhenius fitting function to determine the quantitative relationship from (1):

$$y = a\exp\left(\frac{b}{T}\right) + c \quad (1)$$

wherein a, b, c are fitting parameters, T is a temperature, and y represents a voltage shift of temperature-sensitive feature point;

S3. performing a standardized transformation of the incremental capacity curves at different temperatures; and S4. establishing a quantitative relationship between a transformed height of a capacity-sensitive feature point and a State of Health of the battery based on a BOX-COX transformation.

2. The on-line State of Health estimation method of the battery in the wide temperature range according to claim 1, wherein the standardized transformation of the incremental capacity curves at different temperatures in S3 comprises obtaining a charging Q-V curve for each battery at the fixed ambient temperature greater than 30° C., shifting the charging Q-V curve for each battery at the fixed ambient temperature greater than 30° C. by a voltage shift to obtain a normalized charging Q-V curve for each battery at the fixed ambient temperature greater than 30° C. and obtaining a normalized incremental capacity curve based on the fixed ambient temperature greater than 25° C. through a numerical differentiation method.

3. The on-line State of Health estimation method of the battery in the wide temperature range according to claim 2, wherein a corresponding voltage shift of the charging Q-V curve is achieved by bringing the temperature into the Arrhenius fitting function.

4. The on-line State of Health estimation method of the battery in the wide temperature range according to claim 1, wherein the selection of the capacity-sensitive feature point in S4 is based on the height of the second inflection point.

5. The on-line State of Health estimation method of the battery in the wide temperature range according to claim 4, wherein based on the capacity-sensitive feature point, the Box-Cox transformation increases linearity between the height of the second inflection point as the capacity-sensitive feature point and the State of Health using a linear regression equation is expressed as (2):

$$Y = X\beta + \varepsilon \quad (2)$$

wherein Y is a dependent variable, X is an independent variable, β is a coefficient matrix, and ε a represents a fitting error;

the Box-Cox transformation is represented as:

$$y_k^{(\lambda)} = \begin{cases} \frac{y_k^\lambda - 1}{\lambda} & \lambda \neq 0 \\ \ln y_k & \lambda = 0 \end{cases} \quad (3)$$

wherein y in the right side of the equation is an original variable, and the subscript k corresponding toy represents a k-th variable, λ is a conversion parameter, $y_k^{(\lambda)}$ in the left side of the equation is a k-th conversion variable.

6. The on-line State of Health estimation method of the battery in the wide temperature range according to claim 5, wherein the implementation of step 4 also includes;

an inverse transformation of is:

$$y_k = \begin{cases} (1 - \lambda y_k^{(\lambda)})^{1/\lambda} & \lambda \neq 0 \\ \exp(y_k^{(\lambda)}) & \lambda = 0 \end{cases} \quad (4)$$

a maximum likelihood function is used to calculate an optimal λ, assuming that ε is independent and obeys a normal distribution, and y conforms to y~(Xβ,σ²I), X is an independent variable matrix, β is the coefficient matrix, σ² is a variance, I is an identity matrix, n is number of samples, the maximum likelihood function is expressed as:

$$L(\beta, \sigma^2 \mid Y, X) = \quad (5)$$
$$-\frac{n}{2}\ln 2\pi - \frac{n}{2}\ln\sigma^2 - \frac{1}{2}\sigma^2[Y^{(\lambda)} - X\beta]^T[Y^{(\lambda)} - X\beta] + (\lambda - 1)\sum_{k=1}^{n}\ln y_k$$

in the formula (5), $Y^{(\lambda)}$ is a dependent variable after conversion, estimated parameters β and σ² can be expressed as:

$$\begin{cases} \beta(\lambda) = (X^T X)^{-1} X^T Y^\lambda \\ \sigma^2(\lambda) = \frac{1}{n}[Y^{(\lambda)} - X\beta]^T [Y^{(\lambda)} - X\beta] \end{cases} \quad (6)$$

substituting formula (6) into (5) and taking logarithmic:

$$L(\lambda) = -\frac{n}{2}(\ln 2\pi + \ln\sigma^2 + 1) + (\lambda - 1)\sum_{k=1}^{n}\ln y_k \quad (7)$$

optimal λ is obtained by maximizing formula (7);

according to the linear regression equation (2), the quantitative relationship between the transformed height of the capacity-sensitive feature point and the State of Health is then established.

7. The on-line State of Health estimation method of the battery in the wide temperature range according to claim 1, further comprising generating the state of health of the battery based on receiving charging voltage, current, and temperature of a battery to be measured.

* * * * *